(12) United States Patent
Lai et al.

(10) Patent No.: US 9,310,405 B2
(45) Date of Patent: Apr. 12, 2016

(54) MONITOR APPARATUS AND METHOD FOR IDENTIFYING ELECTRONIC APPARATUS THEREOF

(71) Applicant: Industrial Technology Research Institute, Hsinchu (TW)

(72) Inventors: Chien-Liang Lai, Hsinchu County (TW); Hung-Yuan Chen, Hsinchu County (TW); Lun-Chia Kuo, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 537 days.

(21) Appl. No.: 13/775,265

(22) Filed: Feb. 25, 2013

(65) Prior Publication Data

US 2014/0172328 A1 Jun. 19, 2014

(30) Foreign Application Priority Data

Dec. 17, 2012 (TW) .............................. 101147911 A (51) Int. Cl.
| | |
|---|---|
| *G01R 21/133* | (2006.01) |
| *G01R 19/25* | (2006.01) |
| *G01R 21/06* | (2006.01) |

(52) U.S. Cl.
CPC .......... *G01R 21/133* (2013.01); *G01R 19/2513* (2013.01); *G01R 21/06* (2013.01)

(58) Field of Classification Search
CPC .................................................... G01R 21/133
USPC .......................................................... 702/60
See application file for complete search history.

(56) References Cited

U.S. PATENT DOCUMENTS

| | | | |
|---|---|---|---|
| 4,242,663 | A | 12/1980 | Slobodin |
| 4,858,141 | A | 8/1989 | Hart et al. |

(Continued)

FOREIGN PATENT DOCUMENTS

| | | |
|---|---|---|
| CN | 2007087237 | 4/2007 |
| CN | 101667166 | 3/2010 |

(Continued)

OTHER PUBLICATIONS

Liang et al., "Load Signature Study—Part II: Disaggregation Framework, Simulation, and Applications," IEEE Transactions on Power Delivery 25 (2), Apr. 2010, pp. 561-569.

(Continued)

*Primary Examiner* — Tung S Lau
*Assistant Examiner* — Xiuquin Sun
(74) *Attorney, Agent, or Firm* — Jianq Chyun IP Office (57) ABSTRACT

A method for identifying an electronic apparatus is provided. The method is adapted for a monitor apparatus in a power system, and includes the following steps of adaptively updating a power signature database related to at least one electronic apparatus; adaptively updating a line resistance database related to the monitor apparatus; detecting whether at least one power signature event occurs; calculating a system impedance of the at least one power signature event when the at least one power signature event occurs; and identifying at least one unknown electronic apparatus resulting the at least one power signature event according to the system impedance, the power signature database and the line resistance database.

18 Claims, 3 Drawing Sheets

(56) References Cited

U.S. PATENT DOCUMENTS

| | | | |
|---|---|---|---|
| 6,043,915 A * | 3/2000 | Giles | H04B 10/077 398/1 |
| 7,965,174 B2 | 6/2011 | Wong et al. | |
| 8,094,034 B2 | 1/2012 | Patel et al. | |
| 8,209,062 B2 | 6/2012 | Andrews et al. | |
| 2002/0130652 A1 | 9/2002 | Bessler | |
| 2006/0173655 A1 * | 8/2006 | Amano | G01R 31/31721 702/185 |
| 2010/0305889 A1 | 12/2010 | Tomlinson, Jr. et al. | |
| 2011/0191041 A1 * | 8/2011 | Diop | G01R 21/133 702/61 |
| 2014/0067299 A1 * | 3/2014 | Lu | G06K 9/00536 702/65 |

FOREIGN PATENT DOCUMENTS

| | | |
|---|---|---|
| CN | 102193041 | 9/2011 |
| CN | 102279326 | 12/2011 |
| CN | 102338834 | 2/2012 |
| CN | 102486502 | 6/2012 |
| TW | M248119 | 10/2004 |
| TW | M341981 | 10/2008 |
| TW | 201116836 | 5/2011 |
| TW | 201118384 | 6/2011 |
| TW | 201118385 | 6/2011 |
| TW | 201203770 | 1/2012 |

OTHER PUBLICATIONS

Quilumba et al., "Load Model Development for Next Generation Appliances," IEEE Industry Applications Society Annual Meeting (IAS), Oct. 2011, pp. 1-7.

Ruzzelli et al., "Real-time Recognition and Profiling of Appliances through a Single Electricity Sensor," IEEE Conference on Sensor Mesh and Ad Hoc Communications and Networks (SECON), Jun. 2010, pp. 1-9.

Hakkarinen et al., "Circuit-Level Load Monitoring for Household Energy Management," IEEE Pervasive Computing, Jan.-Mar. 2011, pp. 40-48.

Chang et al, "A New Measurement Method for Power Signatures of Nonintrusive Demand Monitoring and Load Identification," IEEE Transactions on Industry Applications 48 (2), Mar. and Apr. 2012, pp. 764-771.

Wang et al., "Residential Appliances Identification and Monitoring by a Nonintrusive Method," IEEE Transactions on Smart Grid, Oct. 3, 2011, pp. 1-13.

Liang et al., "Load Signature Study—Part I: Basic Concept, Structure, and Methodology," IEEE Transactions on Power Delivery 25 (2), Apr. 2010, pp. 551-560.

"Notice of Allowance of Taiwan Counterpart Application", issued on Apr. 10, 2015, p. 1-p. 4.

"Office Action of Chinese Counterpart Application", issued on Dec. 22, 2015, p. 1-9.

* cited by examiner

MONITOR APPARATUS AND METHOD FOR IDENTIFYING ELECTRONIC APPARATUS THEREOF

CROSS-REFERENCE TO RELATED APPLICATION

This application claims the priority benefit of Taiwan application serial no. 101147911, filed on Dec. 17, 2012. The entirety of the above-mentioned patent application is hereby incorporated by reference herein and made a part of this specification.

BACKGROUND

1. Technical Field

The present disclosure relates a monitor apparatus capable of identifying an electronic apparatus according to the power parameter(s) being detected.

2. Description of Related Art

In order to save energy, setup of smart meters and architecture of advanced metering infrastructures (AMI) have been widely adopted. Advanced metering infrastructures may be used to replace the conventional manual metering while increasing energy usage efficiency. According to a research, users tend to save energy spontaneously when they are informed of a total energy usage in the house. The users may save even more energy if they may be informed of energy usage in each electronic apparatus used at home.

A conventional method used to monitor whether any of the electronic apparatus being turned on or turned off is by adding a sensor into each electronic apparatus, such method belongs to an intrusive load monitoring. Nevertheless, a nonintrusive appliance load monitoring is another conventional method which can be used to determine which electronic apparatus is turned on or turned off after a total power signature of all electronic apparatuses is detected. Therefore, how to accurately determine which electronic apparatus is turned on or turned off using the nonintrusive appliance load monitoring has become one of the major subjects in the industry. Another issue yet to be overcome is to identify the same electronic apparatus without installing other devices thereto.

SUMMARY

Accordingly, the present disclosure provides a monitor apparatus and a method for identifying an electronic apparatus thereof, which are capable of identifying the electronic apparatus according to the power parameter(s) detected in case when the electronic apparatus is without a measuring apparatus.

The present disclosure provides a method for identifying an electronic apparatus. The method is adapted for a monitor apparatus in a power system, and the method includes the following steps. First, a power signature database related to at least one electronic apparatus is adaptively updated and a line resistance database related to the monitoring apparatus is also adaptively updated. Next, whether at least one power signature event occurs is detected. A system impedance of the at least one power signature event is calculated when the at least one power signature event occurs. Afterwards, at least one unknown electronic apparatus resulting the power signature event is identified according to the system impedance, the power signature database and the line resistance database.

The present disclosure also provides a monitor apparatus including a storage module, a detecting module and a processing module. The storage module stores a power signature database and a line resistance database, in which the power signature database is related to at least one electronic apparatus, and the line resistance database is related to a power system where the monitor apparatus being located. The detecting module detects whether at least one power signature event occurs. The processing module is coupled to the storage module and the detecting module to adaptively update the power signature database and the line resistance database. A system impedance of the at least one power signature event is calculated when the at least one power signature event occurs. And, the processing module identifies at least one unknown electronic apparatus resulting the power signature event according to the system impedance, the power signature database and the line resistance database.

Based on above, when at least one power signature event is detected by the monitor apparatus of the present disclosure, the monitor apparatus of the present disclosure may identify an electronic apparatus resulting the at least one power signature event according to a system impedance of the at least one power signature event.

To make the above features and advantages of the present disclosure more comprehensible, several embodiments accompanied with drawings are described in detail as follows.

It will be apparent to those skilled in the art that various modifications and variations can be made to the disclosed embodiments. It is intended that the specification and examples be considered as exemplary only, with a true scope of the disclosure being indicated by the following claims and their equivalents.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Descriptions of the present disclosure are given with reference to the exemplary embodiments illustrated with accompanied drawings, wherein same or similar parts are denoted with same reference numerals. In addition, whenever possible, identical or similar reference numbers stand for identical or similar elements in the figures and the embodiments.

Figure 1:
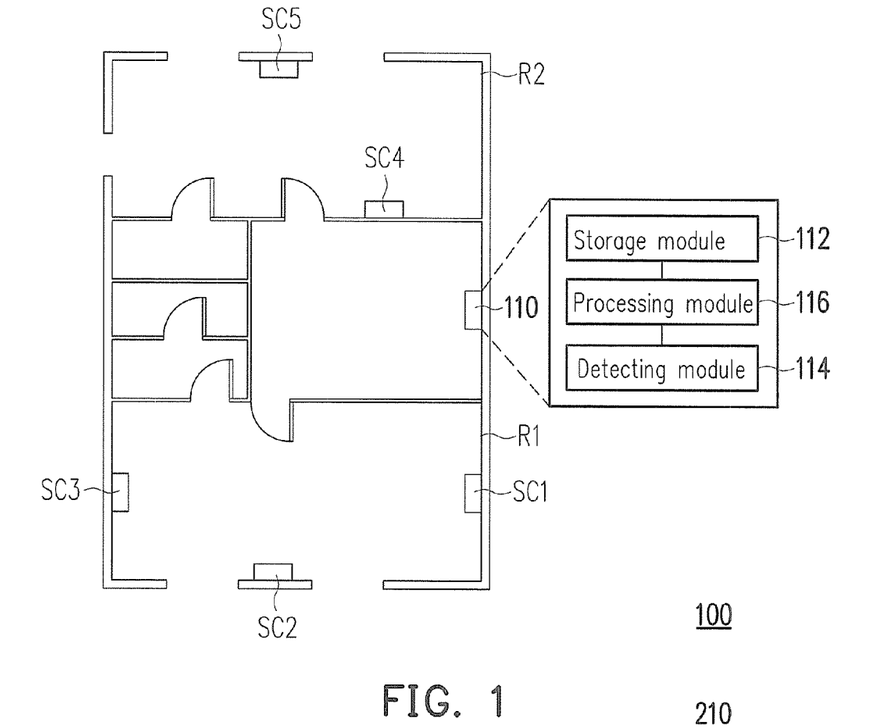
FIG. 1 is a schematic view illustrating an indoor space according to an embodiment of the present disclosure.

FIG. 1 is a schematic view illustrating an indoor space according to an embodiment of the present disclosure. Referring to FIG. 1, an indoor space 100 is, for example, a general home having a monitor apparatus 110 and sockets SC1 to SC5. The monitor apparatus 110 may be, for example, a power meter (e.g., a digital power meter or a smart meter) in an electric box located at the indoor space 100, which may monitor power usage of each electronic apparatus used in the indoor space 100. The monitor apparatus 110 includes a storage module 112, a detecting module 114 and a processing module 116. The storage module 112 may be, for example, any storage medium capable of storing data. The detecting module 144 may be, for example, a measuring device for voltage, current and/or power, which may detect voltage, current and/or power of any line connected to the monitor apparatus 110. The processing module 116 may be, for example, a processor with computing capabilities.

The electronic apparatus may be, for example, a common appliance such as an electric fan, an electric heater, a hair dryer, a dehumidifier and a rice cooker, but the present disclosure is not limited thereto. For instance, when a user connects an electronic apparatus to the socket SC1, said power meter may monitor and record parameters such as power consumption during operations of the electronic apparatus through a line connected between the electronic apparatus and the socket SC1.

In the present embodiment, the monitor apparatus 110 may take both a power signature of the electronic apparatus and a line impedance of the lines in the building into account, once a power signature event occurs, the electronic apparatus corresponding to such power signature event and an operating location thereof may then be identified. The power signature may be, for example, voltage, current, active power, reactive power, power factor and apparent power of the electronic apparatus, but the present disclosure is not limited thereto. The power signature event may be, for example, variation of the parameters, such as voltage, current and power detected by the detecting module 114 during the operations of the electronic apparatus.

More specifically, the storage module 112 may store a power signature database used to record the power signatures of various electronic apparatuses connected to the monitor apparatus 110 through the sockets SC1 to SC5. The power signatures of various electronic apparatuses may be measured by the user through a specific measuring apparatus. The measuring apparatus may be apparatuses such as a power supply, a voltmeter and an amperemeter. Person with ordinary skill in the art should understand that, the power signature of the electronic apparatus (e.g., impedance) may be calculated by Ohm's Law or other measuring or calculating methods once an applied voltage and a line current is obtained. Therefore, details in regard to measuring of the power signature by the measuring apparatus are omitted herein.

TABLE 1

Power Signature Database

| Electronic apparatus | Power signature | | | |
|---|---|---|---|---|
| | Impedance (Ω) | Voltage (V) | Current (A) | Power (W) |
| First electronic apparatus | 12.61 | 120 | 9.57 | 1142 |
| Second electronic apparatus | 15.74 | 120 | 7.66 | 915 |

The power signature database in the storage module 112 may be represented in a table as Table 1 above. According to Table 1, the power signature database includes power signatures related to a first electronic apparatus and a second electronic apparatus, such as impedance, voltage, current and power. In addition, according to other embodiments, the electronic apparatus may have different operation modes, such that the power signature database in the storage module 112 may also separately store the power signatures of the electronic apparatus in different operation modes.

According to an embodiment, the user may update an existing power signature database in the storage module 112 after a power signature data of each electronic apparatus is measured. According to another embodiment, the measuring apparatus may include a communication module used to transmit the power signature data to the monitor apparatus 110 after the power signature data of each electronic apparatus is measured by the user. In other words, the monitor apparatus 110 may also include another communication module used to receive the power signature data transmitted by the measuring apparatus.

In addition, the storage module 112 may further include a line resistance database used to record line resistances between the monitor apparatus 110 and the sockets SC1 to SC5. The line resistances between the monitor apparatus 110 and the sockets SC1 to SC5 may be easily measured by the user. For instance, the user may connect the line resistance measuring device respectively to the sockets SC1 to SC5, so as to measure the line resistances between the sockets SC1 to SC5 and the monitor apparatus 110.

Figure 2:
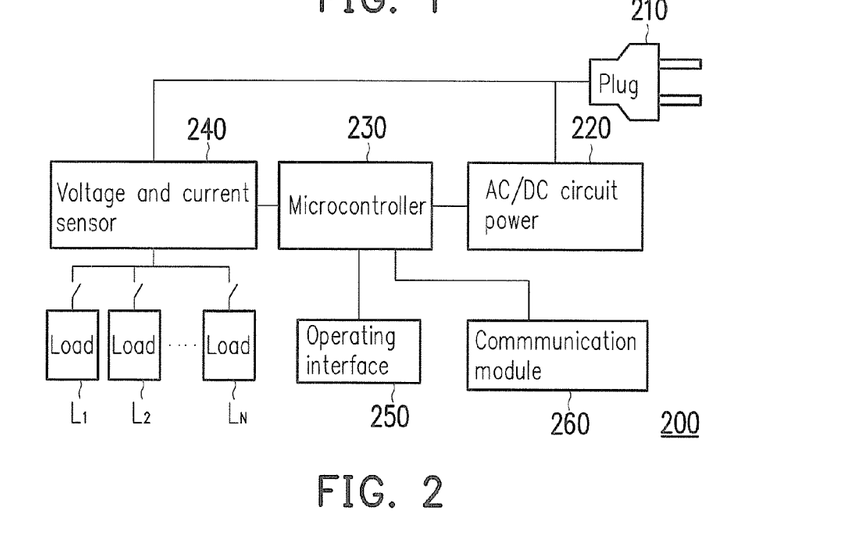
FIG. 2 is a schematic view illustrating a line resistance measuring device according to an embodiment of the present disclosure.

FIG. 2 is a schematic view illustrating a line resistance measuring device according to an embodiment of the present disclosure. Referring to FIG. 1 and FIG. 2 together, a line resistance measuring device 200 includes a plug 210, an AC/DC circuit power 220, a microcontroller 230, a voltage and current sensor 240, an operating interface 250 and a communication module 260. The plug 210 is coupled to the AC/DC circuit power 220 and the voltage and current sensor 240. The plug 210 may be used for connecting the socket (e.g., the socket SC1). The microcontroller 230 is coupled to the AC/DC circuit power 220, the voltage and current sensor 240, the operating interface 250 and the communication module 260. The microcontroller 230 may be used to control the voltage and current sensor 240 to switch between loads $L_1$ to $L_N$ in response to the operating interface 250 operated by the user. When a load resistance is already known, since the microcontroller 230 may calculate the line resistance between the socket (e.g., the socket SC1) and the monitor apparatus 110 according to a loop voltage and a loop current measured by the voltage and current sensor 240, detail thereof is omitted herein.

Since wire lines are generally being implemented using metal material with particular specifications (e.g., a copper line), thus, after the line resistance between the socket (e.g., the socket SC1) and the monitor apparatus 110 is obtained, the microcontroller 230 may calculate a line length between the socket and the monitor apparatus by using a formula (1) below.

$$L = \frac{R\pi(d)^2}{4\rho} \qquad (1)$$

In which, L denotes a line length, R denotes a line resistance being measured, d denotes a diameter of the line, and ρ denotes a resistance coefficient of the line. For instance, in case where a line is made of a cooper line having a diameter of 1.28 mm and a line resistance measured is 0.314Ω, since a resistance coefficient of the copper line is $0.178 \times 10^{-7}$ Ωm, a result of the line length between the socket SC1 and the monitor apparatus 110 being 22.7 m may be calculated by the microcontroller 230 according to the formula (1).

Therefore, the microcontroller 230 may calculate the line lengths between the sockets SC1 to SC5 and the monitor apparatus 110 after the line resistances between the sockets SC1 to SC5 and the monitor apparatus 110 are measured by the user with the measuring device 200. Later, the user may update the line resistance database of the monitor apparatus 110 according to relative locations of the monitor apparatus 110 and the sockets SC1 to SC5. The line resistance database in the monitor apparatus 110 may be represented in a table as Table 2 below.

TABLE 2

Line Resistance Database

| Socket | Line resistance (Ω) | Socket location | Line length (m) |
|---|---|---|---|
| Socket SC1 | 0.314 | Room R1 | 22.70 |
| Socket SC2 | 0.493 | Room R1 | 35.63 |
| Socket SC3 | 0.529 | Room R1 | 38.24 |
| Socket SC4 | 0.210 | Room R2 | 15.18 |
| Socket SC5 | 0.164 | Room R2 | 11.85 |

In the line resistance measuring device 200, the user may set locations of the sockets SC1 to SC3 to be corresponding to the room R1 through the operating interface 250, whereas the sockets SC4 to SC5 are corresponding to the room R2. After relative relations of the rooms R1 to R2 and the sockets SC1 to SC5 are set, the user may control the communication module 260 through the microcontroller 230 to transmit the line resistance data to the communication module on the monitor apparatus 110, so as to update the line resistance database on the monitor apparatus 110. However, persons with ordinary skill in the art should appreciate that above mentioned parameters and space arrangement are not to be used to limit implementation of the present disclosure.

Figure 3:
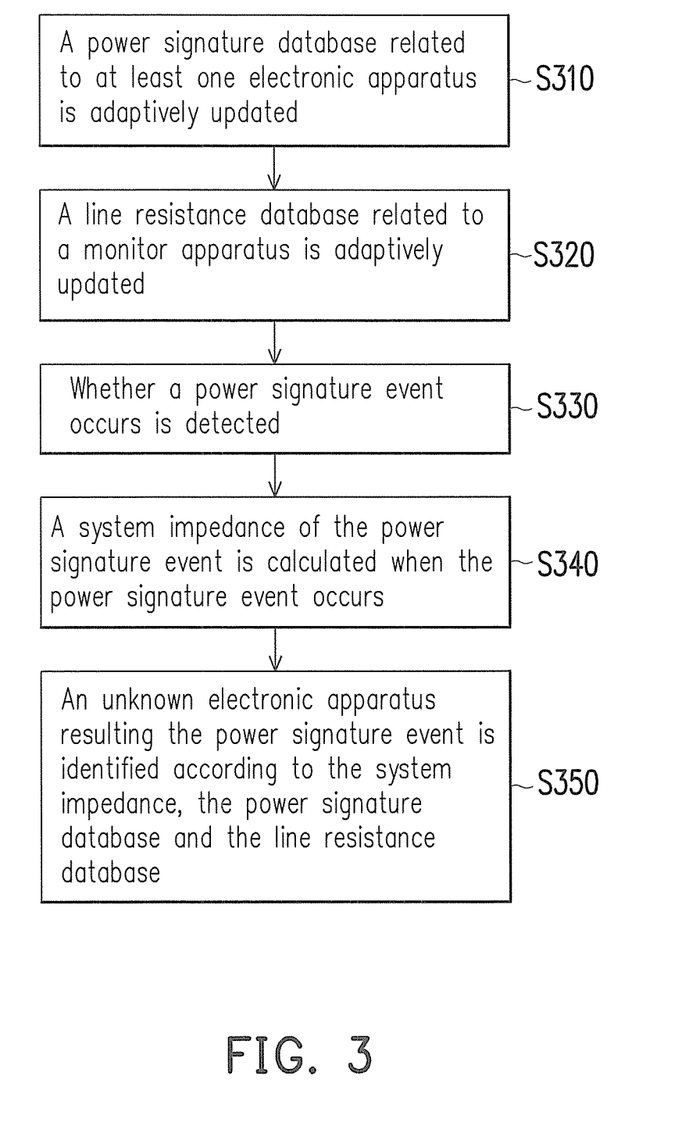
FIG. 3 is a flowchart illustrating a method for identifying an electronic apparatus according to an embodiment of the present disclosure.

FIG. 3 is a flowchart illustrating a method for identifying an electronic apparatus according to an embodiment of the present disclosure. Referring to FIG. 1 and FIG. 3 together, the method of the present embodiment is adapted for the monitor apparatus 110 in FIG. 1. Steps of the method in the present embodiment are described with reference to the elements and space arrangements as illustrated in FIG. 1. First, in step S310, the processing module 116 may adaptively update a power signature database. Specifically, each time the power signature data of the electronic apparatus is measured by the user and transmitted/input to the monitor apparatus 110, the monitor apparatus 110 may adaptively update the power signature database therein, so as to instantly administer the electronic apparatuses that may appear in the indoor space 100.

Next, in step S320, the processing module 116 may adaptively update a line resistance database. That is, when the line resistance data of the sockets SC1 to SC5 are respectively measured by the user, the processing module 116 may adaptively update the line resistance database therein in response to the line resistances measured by the user, so as to administer the line resistance between each socket (i.e., the sockets SC1 to SC5) and the monitor apparatus 110 in the monitoring range (i.e., the indoor space 100).

After the power signature database and the line resistance database are updated, in step S330, the detecting module 114 may detect whether a power signature event occurs. The power signature event may be, for example, variation to the parameters, such as voltage, current and power detected by the detecting module 114 during operations of an unknown electronic apparatus powered by one specific socket in the indoor space 110. However, for the processing module 116, the power signature event is only the variations to the data measured, which cannot be directly used to identify which electronic apparatus is operated to result in said power signature event. Therefore, in step S340, the processing module 116 may further calculate a system impedance of the power signature event once the power signature event occurs, the system impedance may then be used as a reference information for identifying the unknown electronic apparatus and the operating location thereof.

Generally, the operating state of the electronic apparatus includes a transient state period and a steady state period. Since the operations of the unknown electronic apparatus during the transient state period are relatively unstable, so the parameters (e.g., voltage, current, power) measured by the detecting module 114 may not be suitable to be used as the reference information for identifying the unknown electronic apparatus and the operating location thereof. Therefore, after the unknown electronic apparatus enters the steady state period, the operations of the unknown electronic apparatus may be relatively stable, such that the detecting module 114 may detect a steady state power signature of the power signature event which may be used as the reference information for identifying the unknown electronic apparatus and the operating location thereof. The steady state power signature may be, for example, parameters such as voltage, current and power of the power signature event.

TABLE 3

Steady State Power Signature

| Electronic apparatus | Voltage (V) | Current (A) | Power (W) |
|---|---|---|---|
| Unknown electronic apparatus | 116.85 | 8.86 | 1034 |

After data of the steady state power signature as shown in Table 3 is measured, the processing module 116 may calculate the system impedance according to information in both Table 1 (the power signature database) and Table 2 (the line resistance database). In this case, since voltage measured in Table 3 is 116.85V, and Table 1 is established on basis of voltage being 120V, thus the processing module 116 may perform a normalizing process to the data in Table 3 on basis of voltage being 120V, so as to facilitate subsequent operations for identifying the unknown electronic apparatus.

TABLE 4

Steady State Power Signature (Normalized)

| Electronic apparatus | Voltage (V) | Current (A) | Power (W) | System impedance (Ω) |
|---|---|---|---|---|
| Unknown electronic apparatus | 120 | 9.088 | 1090.5 | 13.205 |

Table 4 is, for example, data obtained after normalizing the data in Table 3 on basis of voltage being 120V. The power with value of 1090.5 W may be calculated by using a normalizing formula of $1034 \times (120/116.85)^2$. Furthermore, the processing module 116 may calculate the system impedance corresponding to the power signature event according to the data in Table 4 (e.g., voltage and power). In Table 4, the system impedance with value of 13.205Ω may be calculated by a formula of $120^2/1090.5$ (i.e., voltage squared divided by power), whereas the current with value of 9.088 A may be calculated by a formula of 1090.5/120 (i.e., power divided by voltage).

Next, in step S350, the processing module 116 may identify the unknown electronic apparatus resulting the power signature event according to the system impedance, the power signature database and the line resistance database. Detailed description will be described hereinafter.

According to the present embodiment, in order to simplify the description regarding a fact that the unknown electronic apparatus uses a pure resistive load, the system impedance may be deem to as a sum of an impedance of the unknown electronic apparatus and an line (i.e., the line between the socket to the monitor apparatus 110) resistance/impedance. In other words, the system impedance includes two variables, in which one variable being the impedance of the unknown electronic apparatus and another one variable being the line resistance. Therefore, in order to use the system impedance for identifying the unknown electronic apparatus and the operating location thereof, the processing module 116 may establish an impedance combination table according to all possible values of the two variables. Referring to values in Table 1 and Table 2 for all possible values of the two variables.

TABLE 5

Impedance Combination Table

| | Electronic apparatus | |
| --- | --- | --- |
| | First electronic apparatus (12.61 Ω) | Second electronic apparatus (15.74 Ω) |
| Line resistance | Impedance combination value | |
| Socket SC1 (0.314 Ω) | 12.924 Ω | 16.054 Ω |
| Socket SC2 (0.493 Ω) | 13.103 Ω | 16.233 Ω |
| Socket SC3 (0.529 Ω) | 13.139 Ω | 16.269 Ω |
| Socket SC4 (0.210 Ω) | 12.82 Ω | 15.95 Ω |
| Socket SC5 (0.164 Ω) | 12.774 Ω | 15.904 Ω |

The impedance combination table may be represented in a table as Table 5. The impedance value with value of 12.924Ω may be calculated by a formula of 12.61+0.314 (i.e., a sum of impedance in the first electronic apparatus and the line resistance of the socket SC1), whereas the impedance value with value of 16.233Ω may be calculated by a formula of 15.74+0.493 (i.e., a sum of impedance in the second electronic apparatus and the line resistance of the socket SC2). The rest of impedance values may be inferred from the above calculations, thus it is omitted herein.

Each of the impedance combination values in Table 5 may be deemed as the system impedance generated after the electronic apparatus is connected to the socket.

Take the impedance value with value of 12.924Ω as an example, said impedance value represents a loop equivalent impedance monitored by the monitor apparatus 110 when the first electronic apparatus is connected to the socket SC1.

Take the impedance value with value of 16.054Ω as another example, said impedance value represents a loop equivalent impedance monitored by the monitor apparatus 110 when the second electronic apparatus is connected to the socket SC1. The rest of impedance values may be inferred from the connecting relations of the electronic apparatuses to the sockets, thus it is omitted herein.

Therefore, the processing module 116 may compare the system impedances measured in Table 4 respectively with the impedance combination values in Table 5, so as to obtain the impedance combination value being closest to the system impedance in Table 5.

Afterwards, the monitor apparatus 110 may determined which combination of the electronic apparatus and the socket is resulting the power signature event, thereby identifying the unknown electronic apparatus and the operating location thereof

TABLE 6

Impedance difference table (impedance combination value subtracted by the system impedance)

| | Electronic apparatus | |
| --- | --- | --- |
| | First electronic apparatus (12.61 Ω) | Second electronic apparatus (15.74 Ω) |
| Line resistance | Impedance difference | |
| Socket SC1 (0.314 Ω) | −0.281 Ω | 2.849 Ω |
| Socket SC2 (0.493 Ω) | −0.102 Ω | 3.028 Ω |
| Socket SC3 (0.529 Ω) | −0.066 Ω | 3.064 Ω |
| Socket SC4 (0.210 Ω) | −0.385 Ω | 2.745 Ω |
| Socket SC5 (0.164 Ω) | −0.431 Ω | 2.699 Ω |

According to an embodiment, the processing module 116 may establish an impedance difference table as shown in Table 6. In which, the impedance difference with value of −0.281Ω may be calculated by having 12.924Ω (the impedance combination value) in Table 5 subtracted by 13.205Ω (the system impedance) in Table 4, whereas the impedance difference with value of 3.028Ω may be calculated by having 16.233Ω (the impedance combination value) in Table 5 subtracted by 13.205Ω (the system impedance) in Table 4. The rest of impedance differences in Table 6 may be inferred from the above calculations, thus it is omitted herein. Next, the processing module 116 determines whether a magnitude of each impedance difference is smaller than a preset threshold. After the magnitude of one specific impedance difference being smaller than the preset threshold is determined, the monitor apparatus 110 may obtain a combination of the electronic apparatus and the line resistance corresponding to the impedance difference. In other words, the processing module 116 may then identify the electronic apparatus resulting the power signature event and the operating location thereof.

For instance, when the preset threshold is 0.1, the processing module 116 may compare the magnitude of each impedance difference in Table 6 with 0.1, so as to obtain the impedance difference with the magnitude being smaller than 0.1 (i.e., the impedance difference with value of −0.066Ω). The combination of the electronic apparatus and the line resistance corresponding to the impedance difference with value of −0.066Ω is the combination of the first electronic apparatus and the socket SC3. Therefore, the processing module 116 may be informed with reference to Table 2 that the first electronic apparatus is located in the room R1 and operated under power provided by the socket SC3.

With the method provided by the embodiments of the present disclosure, the monitor apparatus 110 may administer operation and location of each electronic apparatus in a case when the electronic apparatus is without a power meter. Accordingly, the user may improve power management of the electronic apparatus according to the information provided by the monitor apparatus 110, so as to achieve the effectiveness of, for example, saving energy.

TABLE 7

Steady State Power Signature

| Electronic apparatus | Voltage (V) | Current (A) | Power (W) |
|---|---|---|---|
| Unknown electronic apparatus | 116.28 | 9.17 | 1066 |

The method provided by the present disclosure is further described hereinafter using another example, in which same unknown electronic apparatuses are located at different locations. It is assumed that the steady state power signatures detected by the detecting module 114 are represented by data in Table 7 above, the processing module 116 may also normalize the data in Table 7 to generate normalized data as shown in Table 8 below.

TABLE 8

Steady State Power Signature (Normalized)

| Electronic apparatus | Voltage (V) | Current (A) | Power (W) | System impedance (Ω) |
|---|---|---|---|---|
| Unknown electronic apparatus | 120 | 9.46 | 1135.30 | 12.684 |

Data in Table 8 may be obtained/inferred with reference to the description for Table 4, thus it is omitted herein. Once the system impedance with value of 12.684Ω is obtained, the processing module 116 may also compare the system impedance respectively with the impedance combination value in Table 5, so as to obtain the impedance combination value being closest to the system impedance in Table 5.

TABLE 9

Impedance difference table (impedance combination value subtracted by the system impedance)

| | Electronic apparatus | |
|---|---|---|
| Line resistance | First electronic apparatus (12.61 Ω) | Second electronic apparatus (15.74 Ω) |
| | Impedance difference | |
| Socket SC1 (0.314 Ω) | 0.24 Ω | 3.37 Ω |
| Socket SC2 (0.493 Ω) | 0.419 Ω | 3.549 Ω |
| Socket SC3 (0.529 Ω) | 0.455 Ω | 3.585 Ω |
| Socket SC4 (0.210 Ω) | 0.136 Ω | 3.266 Ω |
| Socket SC5 (0.164 Ω) | 0.09 Ω | 3.22 Ω |

Similarly, the processing module 116 may establish an impedance difference table in a table as Table 9, in which the data may be obtained/inferred with reference to the description for Table 6, thus it is omitted herein.

Next, the processing module 116 may determine whether the magnitude of the each impedance difference is smaller than a preset threshold, and identify the electronic apparatus resulting the power signature event and the operating location thereof according to a result of said determination.

It is also taking the preset threshold with value of 0.1 as an example herein. The processing module 116 may compare the magnitude of each impedance difference in Table 9 with 0.1, so as to obtain the impedance difference with the magnitude being smaller than 0.1 (i.e., the impedance difference with value of 0.09Ω). In this case, the processing module 116 may identify the electronic apparatus based on the impedance difference with value of 0.09Ω. The combination of the electronic apparatus and the line resistance corresponding to the impedance difference with value of 0.09 Ωs is the combination of the first electronic apparatus and the socket SC5. Therefore, the processing module 116 may be informed with reference to Table 2 that the first electronic apparatus is located in the room R2 and operated under power provided by the socket SC5.

Nevertheless, in other embodiments, a case of more than two magnitudes of impedance differences being smaller than the preset threshold at the same may also occurs. In that case, the processing module 116 may introduce another power signature in the power signature database for identifying the unknown electronic apparatus.

TABLE 10

Power Signature Database

| Electronic apparatus | Impedance (Ω) | Voltage (V) | Current (A) | Power (W) | Apparent power (VA) | Power factor |
|---|---|---|---|---|---|---|
| Third electronic apparatus | 9.477 + j0.395 | 120 | 12.15 | 1399 | 1458 | 0.96 |
| Fourth electronic apparatus | 10.007 | 120 | 12.05 | 1446 | 1445 | 1 |

According to an embodiment, the power signature database may be represented in a table as Table 10, whereas the line resistance database may also refer to Table 2. Detailed description will be described with reference to the data in Table 10 hereinafter.

Figure 4:
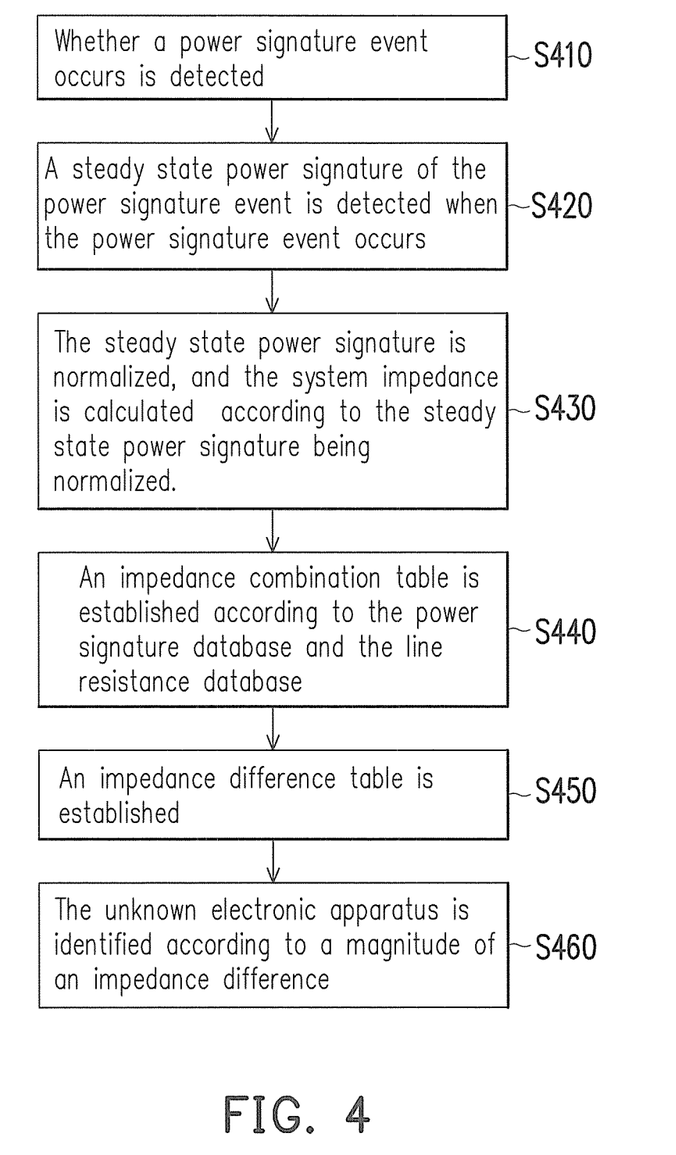
FIG. 4 is a flowchart illustrating a method for identifying an unknown electronic apparatus based on an impedance difference table according to an embodiment of the present disclosure.

FIG. 4 is a flowchart illustrating a method for identifying an unknown electronic apparatus based on an impedance difference table according to an embodiment of the present disclosure. Referring to FIG. 1 and FIG. 4 together, the method of the present embodiment is adapted for the monitor apparatus 110 in FIG. 1. In step S410, the detecting module 114 may detect whether a power signature event occurs. Next, in step S420, the detecting module 144 may detect a steady state power signature of the power signature event once the power signature event occurs.

TABLE 11

Steady State Power Signature

| Electronic apparatus | Voltage (V) | Current (A) | Power (W) | Apparent power (VA) | Power factor |
|---|---|---|---|---|---|
| Unknown electronic apparatus | 118.21 | 11.71 | 1329 | 1384 | 0.96 |

It is assumed that the steady state power signature of the power signature event is represented in a table as Table 11, in step S430, the processing module 116 may normalize the steady state power signatures in Table 11 and thereby calculate the system impedance accordingly.

TABLE 12

Steady State Power Signature (Normalized)

| Electronic apparatus | Voltage (V) | Current (A) | Power (W) | Apparent power (VA) | Power factor | System impedance (Ω) |
|---|---|---|---|---|---|---|
| Unknown electronic apparatus | 120 | 11.41 | 1369.18 | 1426.23 | 0.96 | 10.098 |

The normalized steady power signature and a corresponding system impedance may be represent as data in Table 12.

In step S440, the processing module 116 may establish an impedance combination table according to the power signature data base in Table 10 and the line resistance database in Table 2.

TABLE 13

Impedance Combination Table

| | Electronic apparatus | |
|---|---|---|
| Line resistance | Third electronic apparatus (9.477 + j0.395) | Fourth electronic apparatus (10.007) |
| | Impedance combination value | |
| Socket SC1 (0.314 Ω) | 9.799 Ω | 10.321 Ω |
| Socket SC2 (0.493 Ω) | 9.978 Ω | 10.500 Ω |
| Socket SC3 (0.529 Ω) | 10.0138 Ω | 10.536 Ω |
| Socket SC4 (0.210 Ω) | 9.695 Ω | 10.217 Ω |
| Socket SC5 (0.164 Ω) | 9.649 Ω | 10.171 Ω |

Since the third electronic apparatus in Table 13 has a resistance (j0.395), the calculation of the corresponding impedance combination value is made differently to that in Table 5. For instance, the impedance combination value with value of 9.799 may be calculated by a formula of $\sqrt{(9.477+0.314)^2+0.395^2}$ (i.e., a magnitude obtained from a sum of the impedance of the third electronic apparatus and the line impedance of the socket SC1). The impedance combination value with value of 10.321 may be calculated by a formula of $\sqrt{(10.007+0.314)^2}$ (i.e., a magnitude obtained from a sum of the impedance of the fourth electronic apparatus and the line resistance/impedance of the socket SC1). The rest of impedance values may be inferred from the above calculations, thus it is omitted herein.

Next, in step 440, the processing module 116 may subtract the system impedance in Table 12 with the impedance combination value of the impedance combination table in Table 13, so as to establish an impedance difference table as shown in Table 14.

TABLE 14

Impedance difference table (impedance combination value subtracted by the system impedance)

| | Electronic apparatus | |
|---|---|---|
| Line resistance | Third electronic apparatus (9.477 + j0.395) | Fourth electronic apparatus (10.007) |
| | Impedance difference | |
| Socket SC1 (0.314 Ω) | −0.224 Ω | −0.224 Ω |
| Socket SC2 (0.493 Ω) | 0.119 Ω | −0.403 Ω |
| Socket SC3 (0.529 Ω) | 0.083 Ω | −0.439 Ω |
| Socket SC4 (0.210 Ω) | 0.402 Ω | −0.120 Ω |
| Socket SC5 (0.164 Ω) | 0.448 Ω | −0.074 Ω |

Next in step S406, the processing module 116 may identify the unknown electronic apparatus according to the magnitude of impedance difference. More specifically, the processing module 116 may respectively calculate the magnitude of each impedance difference in Table 14, and determine whether the magnitude of each impedance difference is smaller than the preset threshold. In this case, if the preset threshold is 0.1, both two magnitudes (i.e., 0.083 and −0.074) of the impedance differences being smaller than the preset threshold may occur. In that case, the processing module 116 may introduce another power signature (e.g., the power factor) of the power signature database in facilitating of identifying the unknown electronic apparatus. In other words, the processing module 116 may compare each power factor in Table 12 with the power factor of each electronic apparatus in Table 10. In Table 10, since the power factor of the third electronic apparatus is identical to the power factor of the steady state power factor in Table 12, so that the processing module 116 may determine that the steady state power factor in Table 12 is a result to operations of the third electronic apparatus. Next, the processing module 116 may identify the unknown electronic apparatus as the third electronic apparatus connecting the socket SC3.

In other embodiments, when the detecting module 114 detects more than two power signature events, the processing module 116 may identify the electronic apparatus resulting the power signature event and the location thereof after the corresponding system impedances are respectively calculated. Moreover, in case when a plurality of same electronic apparatuses are operated in different locations, since the electronic apparatus are resulting different power signature events, so that the processing module 116 may identify locations of the electronic apparatuses respectively according to the system impedance, power signature database and the line resistance database corresponding to the power signature events.

In view of above, the method in the embodiments of the present disclosure may allow the monitor apparatus to identify an electronic apparatus resulting the power signature event according to the system impedance of the power signature event without adding power meter to the electronic apparatus. Moreover, the monitor apparatus may locate the socket used by the electronic apparatus according to the system impedance, so as to further determine a location of the electronic apparatus. Accordingly, the user may improve power management of the electronic apparatus according to the information provided by the monitor apparatus, so as to achieve the effectiveness of, for example, saving energy. In addition, since the power signature database may store power signatures of the same electronic apparatus under different operation modes, thus not only the monitor apparatus may identify the electronic apparatus, the operating modes of the electronic apparatus may also be identified.

Although the present disclosure has been described with reference to the above embodiments, it is apparent to one of the ordinary skill in the art that modifications to the described embodiments may be made without departing from the spirit of the present disclosure. Accordingly, the scope of the present disclosure will be defined by the attached claims not by the above detailed descriptions.

The invention claimed is:

1. A method for identifying an electronic apparatus, adapted for a monitor apparatus comprising a detecting module and a processing module in a power system, the method comprising:
   adaptively updating, by the processing module, a power signature database related to at least one electronic apparatus, wherein the monitor apparatus is a power meter;
   adaptively updating, by the processing module, a line resistance database related to the monitor apparatus;
   detecting, by the detecting module, whether at least one power signature event occurs;
   detecting, by the detecting module, a steady state power signature of the at least one power signature event;

normalizing, by the processing module, the steady state power signature;

calculating, by the processing module, a system impedance of the at least one power signature event according to the steady state power signature being normalized; and identifying, by the processing module, at least one unknown electronic apparatus resulting the at least one power signature event according to the system impedance, the power signature database and the line resistance database.

2. The method of claim 1, wherein the step of adaptively updating the power signature database related to the at least one electronic apparatus comprising:

receiving a power signature of the at least one electronic apparatus; and updating the power signature database according to the power signature of the at least one electronic apparatus.

3. The method of claim 2, wherein the power signature database comprises voltage, current, active power, reactive power, power factor and apparent power of each electronic apparatus.

4. The method of claim 1, wherein the step of adaptively updating the line resistance database related to the monitor apparatus comprising:

receiving a line resistance data related to the monitor apparatus; and updating the line resistance database according to the line resistance data.

5. The method of claim 4, wherein the line resistance data comprises a line resistance between the monitor apparatus and at least one socket.

6. The method of claim 1, wherein the step of identifying the at least one unknown electronic apparatus resulting the at least one power signature event according to the system impedance, the power signature database and the line resistance database comprising:

establishing an impedance combination table according to the power signature database and the line resistance database;

establishing an impedance difference table by subtracting the system impedance from at least one impedance combination value of the impedance difference table, wherein the impedance difference table comprises at least one impedance difference; and identifying the at least one unknown electronic apparatus according to a magnitude of the at least one impedance difference.

7. The method of claim 6, wherein the step of identifying the at least one unknown electronic apparatus according to the magnitude of the at least one impedance difference comprising:

determining whether a first impedance difference with an magnitude being smaller than a preset threshold exists in each impedance difference; and determining an amount of the first impedance difference if the first impedance difference with the magnitude being smaller than the preset threshold exists, wherein the at least one electronic apparatus is identified as an electronic apparatus corresponding to the first impedance difference when the amount of the first impedance difference is one, wherein another power signature of the power signature database is introduced for facilitating of identifying the at least one electronic apparatus when the amount of the first impedance difference is greater than one.

8. The method of claim 1, wherein after the step of identifying the at least one unknown electronic apparatus resulting the at least one power signature event, the method further comprises:

identifying an operating location of the at least electronic apparatus according to the system impedance, the power signature database and the line resistance database.

9. The method of claim 1, wherein the at least one unknown electronic apparatus comprises a plurality of same electronic apparatuses, and after the step of identifying the at least one unknown electronic apparatus resulting the at least one power signature event, the method further comprises:

identifying an operating location of each of the plurality of same electronic apparatuses according to the system impedance, the power signature database and the line resistance database.

10. A monitor apparatus, comprising:

a storage module configured to store a power signature database and a line resistance database, wherein the power signature database is related to at least one electronic apparatus, and the line resistance database is related to a power system where the monitor apparatus being located, wherein the monitor apparatus is a power meter;

a detecting module configured to detect whether at least one power signature event occurs; and a processing module coupled to the storage module and the detecting module, and configured to adaptively update the power signature database and the line resistance database;

wherein the detecting module detects a steady state power signature of the at least one power signature event, and the processing module normalizes the steady state power signature and calculates a system impedance of the at least on power signature event according to the steady state power signature being normalized;

wherein the processing module further identifies at least one unknown electronic apparatus resulting the at least one power signature event according to the system impedance, the power signature database and the line resistance database.

11. The monitor apparatus of claim 10, further comprising:

a communication module coupled to the processing module, and configured to receive a power signature of the at least one electronic apparatus, wherein the processing module further updates the power signature database according to the power signature of the at least one electronic apparatus.

12. The monitor apparatus of claim 11, wherein the power signature database comprises voltage, current, active power, reactive power, power factor and apparent power of each electronic apparatus.

13. The monitor apparatus of claim 10, further comprising:

a communication module configured to receive a line resistance data related to the power system, wherein the processing module further updates the line resistance database according to the line resistance data.

14. The monitor apparatus of claim 13, wherein the line resistance data comprises a line resistance between the monitor apparatus and at least one socket.

15. The monitor apparatus of claim 13, wherein the processing module further identifies an operating location of the at least one electronic apparatus according to the system impedance, the power signature database and the line resistance database.

16. The monitor apparatus of claim 10, wherein:
the processing module further establishes an impedance combination table according to the power signature database and the line resistance database;
the processing module further establishes an impedance difference table by subtracting the system impedance from at least one impedance combination value of the impedance difference table, wherein the impedance difference table comprises at least one impedance difference; and
the processing module further identifies the at least one unknown electronic apparatus according to a magnitude of the at least one impedance difference.

17. The monitor apparatus of claim 16, wherein:
the processing module further determines whether a first impedance difference with the magnitude being smaller than a preset threshold exists in each impedance difference,
the processing module further determines an amount of the first impedance difference if the first impedance difference with the magnitude being smaller than of the preset threshold exists,
wherein the processing module further identifies the at least one electronic apparatus as an electronic apparatus corresponding to the first impedance difference when the amount of the first impedance difference is one,
wherein the processing module further introduces another power signature of the power signature database for facilitating of identifying the at least one electronic apparatus when the amount of the first impedance difference is greater than one.

18. The monitor apparatus of claim 10, wherein the at least one unknown electronic apparatus comprises a plurality of same electronic apparatuses, and the processing module further identifies an operating location of each of the plurality of same electronic apparatuses according to the system impedance, the power signature database and the line resistance database.

* * * * *